(12) United States Patent
Nakamura et al.

(10) Patent No.: US 7,560,197 B2
(45) Date of Patent: Jul. 14, 2009

(54) MASK PATTERN DATA PRODUCING METHOD, PATTERNING METHOD, RETICLE CORRECTING METHOD, RETICLE MANUFACTURING METHOD, AND SEMICONDUCTOR APPARATUS MANUFACTURING METHOD

(75) Inventors: Hiroko Nakamura, Yokohama (JP); Toshiya Kotani, Machida (JP); Satoshi Tanaka, Kawasaki (JP); Shoji Mimotogi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 852 days.

(21) Appl. No.: 11/061,599

(22) Filed: Feb. 22, 2005

(65) Prior Publication Data
US 2005/0196684 A1 Sep. 8, 2005

(30) Foreign Application Priority Data
Feb. 23, 2004 (JP) ............................. 2004-046751

(51) Int. Cl.
*G03F 1/06* (2006.01)
(52) U.S. Cl. .................. 430/5; 716/19; 716/21; 430/311; 430/394
(58) Field of Classification Search .............. 430/5, 430/311; 716/19, 21
See application file for complete search history.

(56) References Cited
U.S. PATENT DOCUMENTS
5,725,973 A * 3/1998 Han et al. ...................... 430/5

6,664,011 B2 12/2003 Lin et al.
2001/0042921 A1* 11/2001 Mori et al. .................. 257/758
2002/0172872 A1* 11/2002 Hoshino ......................... 430/5
2004/0082170 A1* 4/2004 Choi et al. .................. 438/689

(Continued)

FOREIGN PATENT DOCUMENTS
JP 11-102062 4/1999

(Continued)

OTHER PUBLICATIONS

Notification of Reasons for Rejection, from the Japanese Patent Office, mailed Feb. 12, 2008, in Japanese Patent Application No. 2005-047474, and English translation thereof.

(Continued)

*Primary Examiner*—Mark F Huff
*Assistant Examiner*—Rashid Alam
(74) *Attorney, Agent, or Firm*—Finnegan, Henderson, Farabow, Garrett & Dunner, L.L.P.

(57) ABSTRACT

A mask pattern data producing method is disclosed, which comprises preparing design pattern data in which contact holes are arranged on part of the grid points in matrix, preparing first mask pattern data in which first opening patterns are arranged on all of the grid points, and designing second mask pattern data in which second opening patterns and third opening patterns are arranged, the second opening patterns being arranged on the grid points at which the contact holes are arranged in the design pattern data to include the first opening patterns, the third opening patterns being arranged on a pair of grid points, which is a pair of diagonal grid points only on which the contact holes are arranged in a unit grid formed by four grid points, to include the first opening patterns arranged on the pair of grid points, in place of the second opening patterns.

8 Claims, 15 Drawing Sheets

U.S. PATENT DOCUMENTS

2005/0014074 A1* 1/2005 Liebmann et al. ............. 430/5
2005/0164095 A1* 7/2005 Ozawa ......................... 430/5

FOREIGN PATENT DOCUMENTS

JP  2000-305247  11/2000

OTHER PUBLICATIONS

Lin; "Semiconductor Foundry, Lithography, and Partners"; Proceedings of SPIE, vol. 4688, pp. 11-24, (2002).

Chang et al.; "Low Proximity Contact Holes Formation by Using Double Exposure Technology (DET)"; Preceedings of SPIE, vol. 5040, pp. 1241-1246, (2003).

* cited by examiner

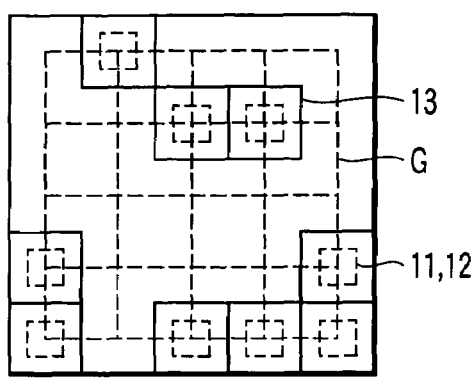
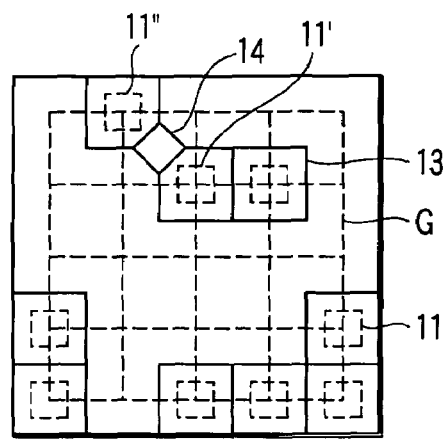
FIG. 4          FIG. 5
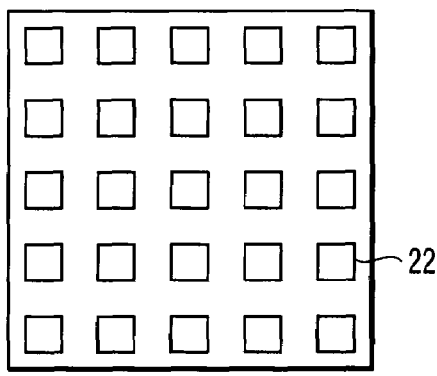
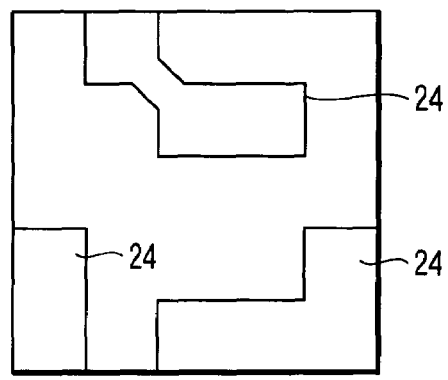
FIG. 6          FIG. 7
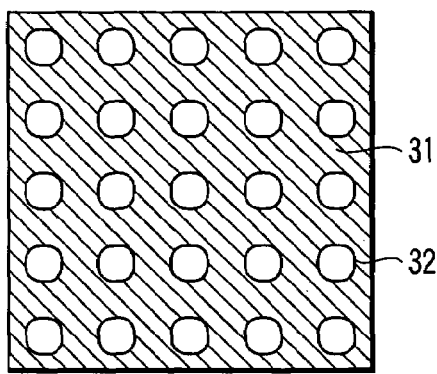
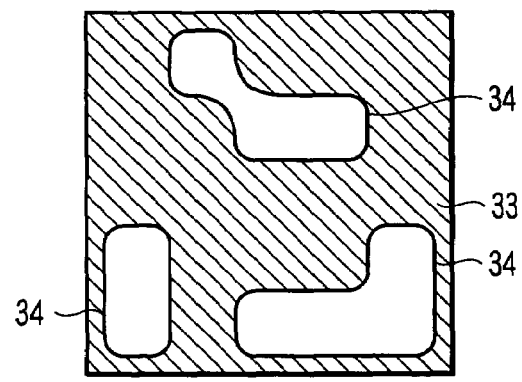
FIG. 8          FIG. 9

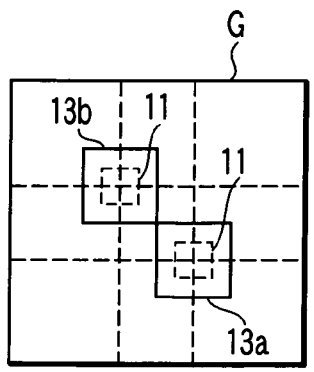
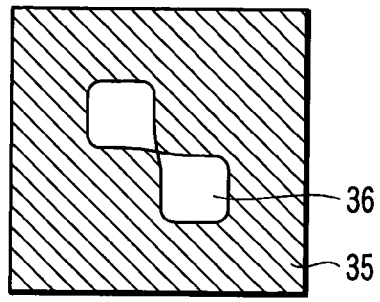
F I G. 10          F I G. 11
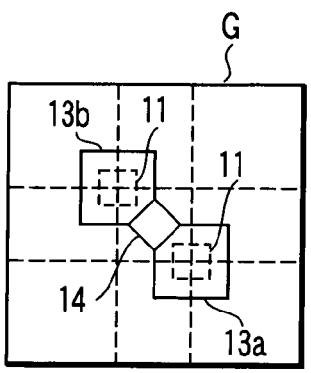
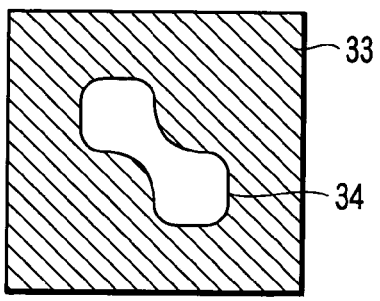
F I G. 12          F I G. 13
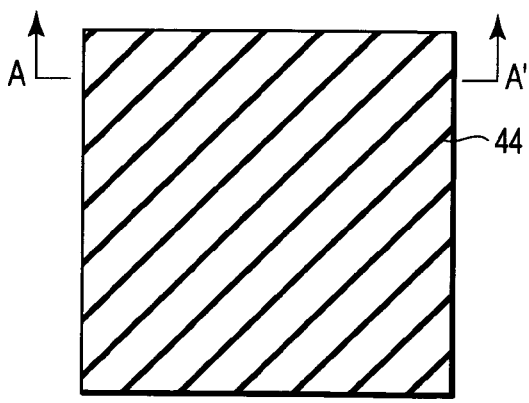
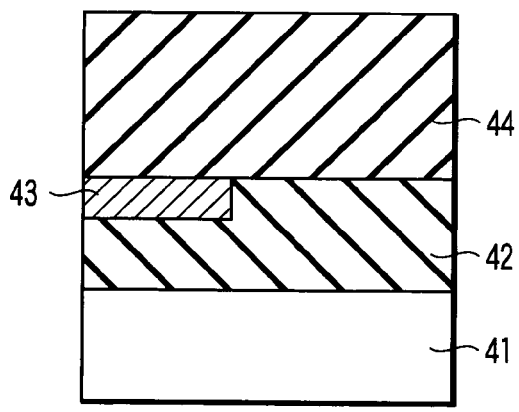
F I G. 14          F I G. 15

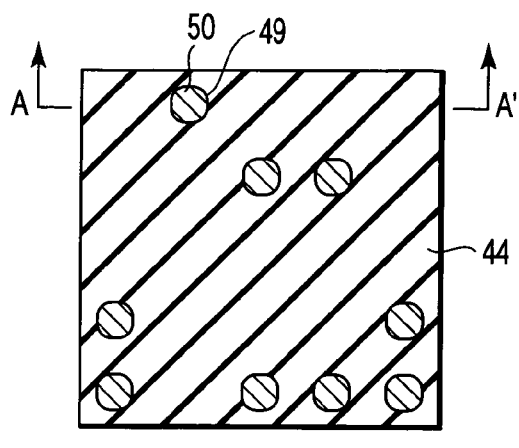
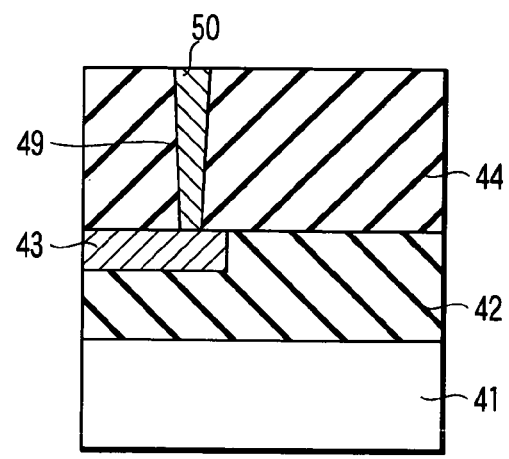
F I G. 22               F I G. 23
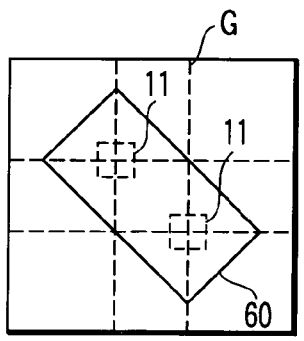
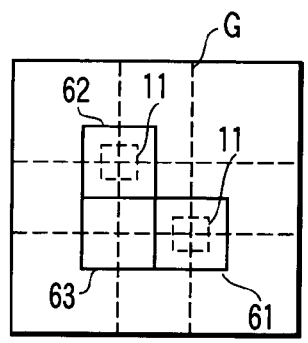
F I G. 24               F I G. 25
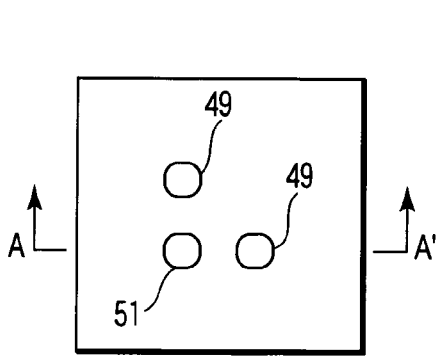
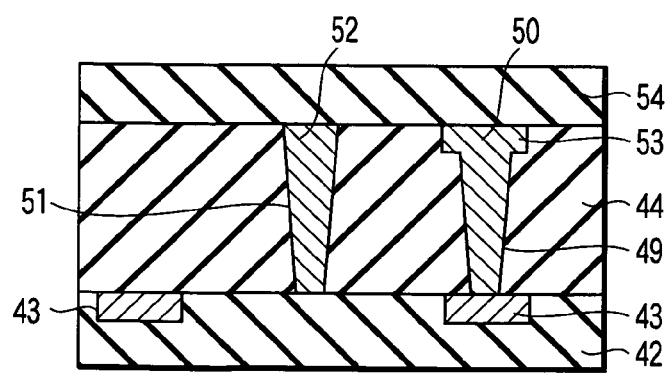
F I G. 26               F I G. 27

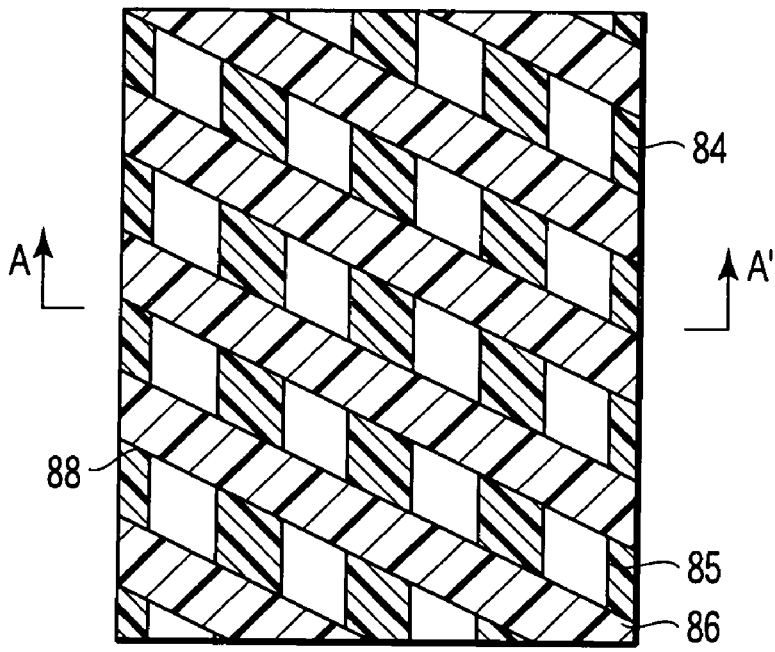
F I G. 40
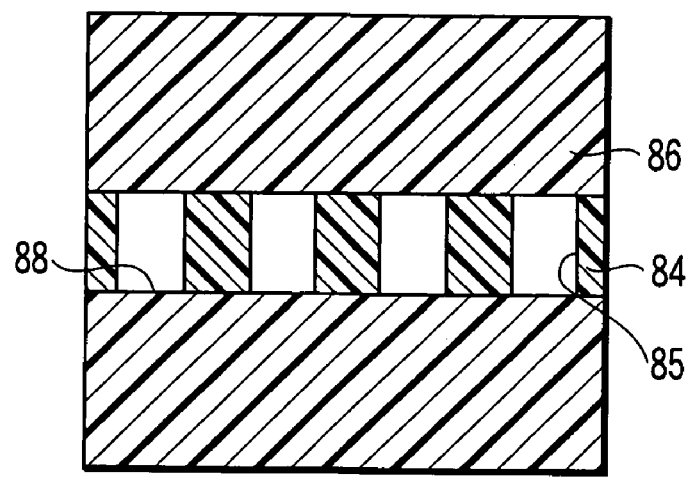
F I G. 41

[MASK PATTERN DATA PRODUCING METHOD, PATTERNING METHOD, RETICLE CORRECTING METHOD, RETICLE MANUFACTURING METHOD, AND SEMICONDUCTOR APPARATUS MANUFACTURING METHOD]{.title}

MASK PATTERN DATA PRODUCING METHOD, PATTERNING METHOD, RETICLE CORRECTING METHOD, RETICLE MANUFACTURING METHOD, AND SEMICONDUCTOR APPARATUS MANUFACTURING METHOD

CROSS-REFERENCE TO RELATED APPLICATIONS

This application is based upon and claims the benefit of priority from prior Japanese Patent Application No. 2004-046751, filed Feb. 23, 2004, the entire contents of which are incorporated herein by reference.

BACKGROUND OF THE INVENTION

1. Field of the Invention

The present invention relates to a mask pattern data producing method, a patterning method, a reticle correcting method, a reticle manufacturing method of patterning a to-be-processed film by a multi-layered resist film, and a semiconductor apparatus manufacturing method.

2. Description of the Related Art

Periodic patterns have high resolution and large exposure margin. Utilizing the high resolution and the large exposure margin of the periodic patterns, many methods have been proposed to form the patterns which cannot be formed by one-time exposure with a sufficient margin.

In upper layer wirings of a logic device, the pitch is fixed and wirings are formed by automatically. Thus, contact holes are positioned on grids.

In the case of a periodic contact hole pattern, the contact hole pattern can be formed with sufficient depth of focus even when the contact hole pattern is fine. However, when the pattern is arranged at random, the minimum critical dimension (CD) of the pattern that can be fabricated is restricted, and sufficient depth of focus cannot be attained. In light of this fact, when upper layer contact holes are formed by automatic wiring, the technique is proposed that periodic contact holes are first formed, and then, undesired contact holes are covered, leaving the desired contact holes open (for example, B. J. Lin, "Semiconductor Foundry, Lithography, and Partners", SPIE 4688, 11 (2002)"; and Charles Chang and other four persons, "Low Proximity Contact Holes Formation by Using Double Exposure Technology (DET)", SPIE 5040, 1241 (2003)).

BRIEF SUMMARY OF THE INVENTION

According to a first aspect of the present invention, there is provided a mask pattern data producing method comprising:

preparing design pattern data in which contact holes are arranged on part of the grid points in matrix;

preparing first mask pattern data in which first opening patterns are arranged on all of the grid points; and designing second mask pattern data in which second opening patterns and third opening patterns are arranged, the second opening patterns being arranged on the grid points at which the contact holes are arranged in the design pattern data to include the first opening patterns, the third opening patterns being arranged on a pair of grid points, which is a pair of diagonal grid points only on which the contact holes are arranged in a unit grid formed by four grid points, to include the first opening patterns arranged on the pair of grid points, in place of the second opening patterns.

According to a second aspect of the present invention, there is provided a reticle manufacturing method comprising:

preparing first and second mask pattern data by using the mask pattern data producing method as recited in the first aspect;

producing a first reticle on the basis of the first mask pattern data; and producing a second reticle on the basis of the second mask pattern data.

According to a third aspect of the present invention, there is provided a semiconductor device manufacturing method comprising:

forming a to-be-processed film on a semiconductor substrate;

forming on the to-be-processed film a first resist film having an opening formed by using the first reticle produced by the reticule manufacturing method as recited in the second aspect;

forming on the first resist film a second resist film having an opening formed by using the second reticle produced by the reticule manufacturing method as recited in the second; and etching the to-be-processed film by using the first resist film and the second resist film.

According to a fourth aspect of the present invention, there is provided a patterning method comprising:

forming a plurality of resist film patterns superposed on a to-be-processed film; and etching the to-be-processed film by using the plurality of superposed resist film patterns as a mask, wherein, CDs of a lower layer resist film pattern are corrected by the quantity of the CD change caused by forming an upper layer resist film pattern at a later step when the lower layer resist film pattern is formed.

According to a fifth aspect of the present invention, there is provided a reticle correcting method comprising:

preparing a plurality of reticles to form a plurality of resist films each having openings on the to-be-processed film;

forming resist pattern films on the to-be-processed film by using the reticles; measuring opening CDs of each resist film immediately after forming each resist pattern film a plurality of times by the number of reticles;

measuring opening CDs of each resist pattern film after all of the resist pattern films are formed;

etching the to-be-processed film by using the plurality of resist pattern films as masks to form the to-be-processed film patterns;

measuring CDs of the to-be-processed film patterns;

correcting opening CDs of each resist film after all of the resist film patterns are formed, by using a measurement value of the CDs of the to-be-processed film and a measurement value of the opening CDs of each resist film after all of the resist patterns are formed, so that CDs of the to-be-processed film pattern are equal to a design value;

correcting opening CDs of each resist film immediately after the each resist film is formed, by using a measurement value of opening CDs of each resist film after all of the resist patterns are formed and a measurement value of opening CDs immediately after each resist film is formed, so that opening CDs of each resist film after all of the resist patterns are formed are equal to the corrected opening CDs of each resist film after all of the resist films are formed; and correcting opening CDs of each reticle to be equal to the corrected opening CDs of each resist film immediately after each resist film is formed.

According to a sixth aspect of the present invention, there is provided a reticle manufacturing method comprising:

producing a plurality of mask pattern data by using the reticule correction method as recited in the fifth aspect; and producing a plurality of reticules on the basis of the corrected plurality of mask pattern data.

According to a seventh aspect of the present invention, there is provided a semiconductor device manufacturing method comprising:

forming a to-be-processed film on a semiconductor substrate;

forming a plurality of resist pattern films on the to-be-processed film by using a plurality of reticules manufactured by the reticule manufacturing method as recited in the sixth aspect; and etching the to-be-processed film by using the plurality of resist pattern films as masks.

BRIEF DESCRIPTION OF THE SEVERAL VIEWS OF THE DRAWING

FIG. 4 is a view for explaining a producing method of second mask pattern data according to the first embodiment of the present invention;

FIG. 5 is a view for explaining a producing method of second mask pattern data according to the first embodiment of the present invention;

FIG. 6 is a view showing a pattern included in first mask pattern data according to the first embodiment of the present invention;

FIG. 7 is a view showing a pattern included in second mask pattern data according to the first embodiment of the present invention;

FIG. 8 is a view showing a first reticle according to the first embodiment of the present invention;

FIG. 9 is a view showing a second reticle according to the first embodiment of the present invention;

FIG. 10 is a view showing a pattern included in the mask pattern data according to the first embodiment of the present invention;

FIG. 11 is a view showing a reticle formed from the mask pattern data shown in FIG. 10;

FIG. 12 is a view showing a pattern included in the second mask pattern data;

FIG. 13 is a view showing a reticle formed from the mask pattern data shown in FIG. 12;

FIG. 14 is a plan view showing a structure of a semiconductor apparatus in the first step of a manufacturing method according to the first embodiment of the present invention;

FIG. 15 is a cross sectional view, taken along the line A-A' in FIG. 14, showing a structure of the semiconductor apparatus shown in FIG. 14;

FIG. 22 is a plan view showing a structure of the semiconductor apparatus in the fifth step of the manufacturing method according to the first embodiment of the present invention;

FIG. 23 is a cross sectional view, taken along the line A-A' in FIG. 22, showing a structure of the semiconductor apparatus shown in FIG. 22;

FIG. 24 is a view showing a pattern included in the second mask pattern data;

FIG. 25 is a view showing a pattern included in the second mask pattern data according to the second embodiment of the present invention;

FIG. 26 is a plan view showing a structure of a semiconductor apparatus according to the second embodiment of the present invention;

FIG. 27 is a cross sectional view, taken along the line A-A' in FIG. 26, showing a structure of the semiconductor apparatus shown in FIG. 26;

FIG. 40 is a view showing, as an example of the fifth embodiment, the pattern made of the first resist film and the second resist film having L&S patterns crossing each other at an angle of 60 degrees;

FIG. 41 is a view showing, as an example of the fifth embodiment, the pattern made of the first resist film having a dense L&S pattern and the second resist film having an isolated space pattern;

DETAILED DESCRIPTION OF THE INVENTION

Hereinafter, embodiments of the present invention will be described with reference to the accompanying drawings.

First Embodiment

A first embodiment of the invention describes a method of changing a pattern of an opening reticle so as not to form a pair of the openings, where the corner of one opening comes into contact with the corner of another opening at a point.

First, a method of adding a rectangular auxiliary pattern inclined at an angle of 45 degrees will be described hereinbelow.

Figure 1:
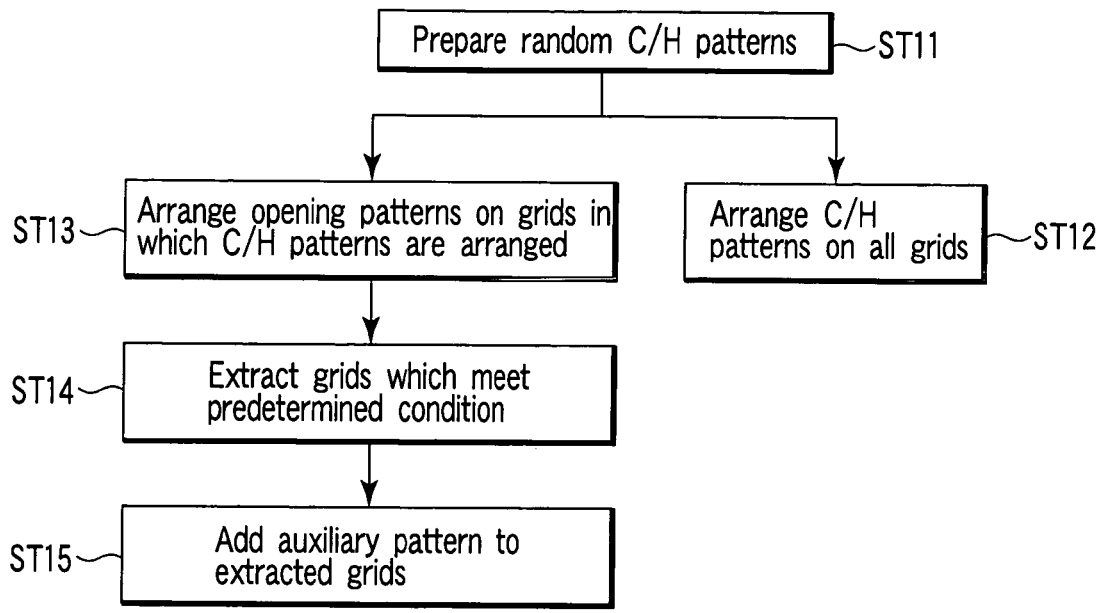
FIG. 1 is a flow chart showing a method of producing mask pattern data according to a first embodiment of the present invention.
Figure 2:
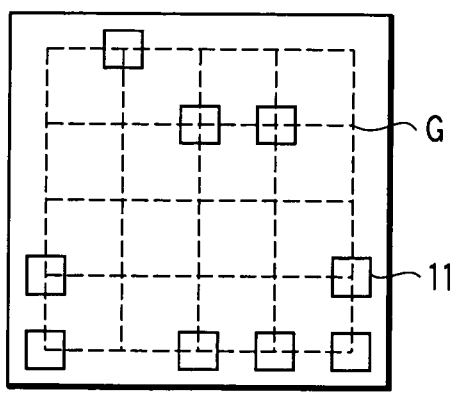
FIG. 2 shows a design pattern according to the first embodiment of the present invention.

FIG. 1 is a flow chart showing a method for producing mask pattern data according to the first embodiment of the invention. FIG. 2 is a view showing a design pattern according to the first embodiment of the invention.

Figure 3:
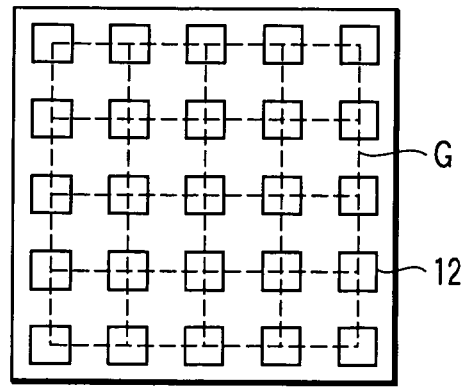
FIG. 3 is a view showing first mask pattern data according to the first embodiment of the present invention.

As shown in FIG. 2, a design pattern data is prepared, in which contact holes (C/H) 11 are arranged at random on cross points of a grid G (hereinafter, referred to as grid points) (step ST11). The grid points are arrayed in matrix. As shown in FIG. 3, a first mask pattern data is formed, in which contact holes 12 (first opening pattern) are arranged on all of the grid points (step ST12). As shown in FIG. 4, a second mask pattern is produced, in which opening patterns 13 (second opening pattern) are arranged on the grid points on which the contact holes shown in FIG. 2 are arranged (step ST13). The size of the opening pattern 13 is required to be a size which contains the contact hole 12 (first opening pattern). In the present embodiment, the shape of the opening pattern 13 is a unit grid composed of four grid points. Next, a grid point pair which applies to a condition is extracted from the design pattern data (step S14). The grid point pair is a pair of diagonal grid points only on which the contact holes 11 are arranged, among the four grid points configuring a unit grid. In the present embodiment, only the contact hole 11" is diagonally arranged to the contact hole 11' when viewed from the contact hole 11', and the grid points at which the contact hole 11' and the contact hole 11" are arranged is grid point pair hole satisfying the condition. A variety of algorithms for the extracting method are provided, and the description of the algorithms is omitted.

Next, as shown in FIG. 5, a rectangular auxiliary pattern 14 (third opening pattern) is added to the second mask pattern at a contact point of the pair of extracted grid points to incline at an angle of 45 degrees so that the rectangular auxiliary pattern 14 is in contact with or overlaps with the second mask pattern (step ST15). One side of the auxiliary pattern 14 may be defined to be ½ of pitch P of the periodic contact hole pattern 12, and in this case a design rule is fulfilled. In addition, in the case where the auxiliary pattern 14 and the opening pattern 13 are defined as separate layers on data, resize quantities of the opening pattern 13 and the auxiliary pattern 14 can be separately adjusted according to a process change.

The execution sequence of steps ST13 to ST15 may be a sequence of step ST14, step ST13, and step ST15 or may be a sequence of step ST14, step ST15, and step ST13.

FIGS. 6 and 7 show patterns included in the first and second mask pattern data designed by the above-described method. FIG. 6 is a view showing a pattern included in the first mask pattern data according to the first embodiment of the present invention. FIG. 7 is a view showing a pattern included in the second mask pattern data according to the first embodiment of the present invention. In FIG. 6, reference numeral 22 denotes a contact hole layer. In FIG. 7, reference numeral 24 denotes an opening pattern layer.

A result obtained by actually forming a reticle pattern based on the pattern data will be described below. This description will be given by way of example of a case of a half-tone film.

A half-tone film is formed on a quartz glass. A resist film was coated on the half-tone film, and a resist film was formed through baking. Based on the above mask data, electron beams were emitted to the resist film by an electron beam writer to expose only a desired region, and then, through post exposure baking and development processes, a resist film pattern was formed. Thereafter, the half-tone film was etched by means of RIE to form a half-tone film pattern. The resist film was peeled, the reticle is rinsed, and a reticle pattern is formed.

First and second reticles were formed by using the first and second mask pattern data illustrated in FIGS. 6 and 7. FIG. 8 is a view showing the first reticle according to the first embodiment of the present invention. FIG. 9 is a view showing the second reticle according to the first embodiment of the present invention. In FIG. 8, reference numeral 31 denotes a half-tone film, and reference numeral 32 denotes a contact hole pattern. In FIG. 9, reference numeral 33 denotes a half-tone film, and reference numeral 34 denotes an opening pattern.

Advantages of the reticle formed by the above-described forming method will be described below. FIG. 10 shows a grid portion which meets the condition described in step ST14 of the conventional mask pattern data. In addition, FIG. 11 shows a reticle formed from the pattern data shown in FIG. 10, which does not have an auxiliary pattern. In FIG. 11, reference numeral 35 denotes a half-tone film, and reference numeral 36 denotes an opening.

In the case where an auxiliary pattern is not formed at a portion (point contact portion) at which an opening pattern 13a and an opening pattern 13b come into contact with each other, a pattern shape of the resist film of the mask at the portion is subjected to a slight process change, so that pattern CDs and shape are changed, and the tapered angle of the resist film is also changed. The half-tone film pattern manufactured through etching by using the resist film as an etching mask is affected by the resist pattern change described above, and is subjected to a slight process change, and thus, the pattern CDs and shape are changed. In this situation, there is a problem that a desired contact hole pattern cannot be obtained. When a resist opening pattern is formed by using the second reticle on the resist contact hole pattern formed by using the first reticle on a wafer, a part of the contact holes to be opened in the lower layer resist film is covered by the upper layer resist film formed by using the second reticle. Further, in the step of inspecting the reticle, if the inspection sensitivity is high, many pseudo defects are detected, thus making it difficult to make correct-inspection for the pattern. If the inspection sensitivity is low, defects will be missed, thus making it difficult to fabricate a good reticle.

FIG. 12 shows a grid portion which meets the condition described in step ST14 of the mask pattern data designed by using the method described in the present embodiment. In addition, FIG. 13 shows a reticle formed from the mask pattern data shown in FIG. 12, in which an auxiliary pattern arranged.

In this case, a portion corresponding to a point contact portion is opened with the CD which is greater than a predetermined CD. Thus, even if a slight process change occurs, CD and shape of the portion which corresponds to the point contact portion of the opening patterns 13a and 13b does not change greatly both in the reticle resist pattern and in the reticle pattern. Therefore, when a resist opening pattern is formed by using the second reticle on the resist contact hole pattern formed by using the first reticle on a wafer, the contact hole pattern to be opened of the lower layer resist film is not covered by the upper layer resist film. Accordingly, a desired contact hole pattern can be obtained. Also, the reticle can be inspected with proper sensitivity, so that the good reticle can be fabricated.

Now, the method how to form the pattern on a wafer by using the reticle shown in FIGS. 8 and 9 is described below. As an example, a description will be given with respect to the case in which a 1:1 contact hole with 200 nm pitch (that is, 100 nm hole diameter) is formed as the first resist film pattern, and thereafter the second resist film pattern is formed in such a manner that only desired contact holes are opened and unnecessary contact holes are covered.

Since the CD of the reticle pattern is slightly changed by the process selection, according to a conversion difference of the CD between the reticle and the resist pattern on the wafer and a conversion difference of the CD between the resist and the to-be-processed film after etching, data of the contact hole diameter depends on the process. However, it is about 100 nm. The length of one side of the opening pattern of the reticle is about 200 nm, and the length of one side of the auxiliary pattern is about 100 nm. These values are also changed depending on a process.

FIGS. 14 to 23 are views showing the steps of manufacturing a semiconductor apparatus according to the first embodiment of the present invention. FIGS. 14, 16, 18, 20 and 22 are plan views, and FIGS. 15, 17, 19, 21 and 23 are cross sectional views taken along the line A-A' of FIGS. 14, 16, 18, 20 and 22.

As shown in FIGS. 14 and 15, a semiconductor substrate 41 in the process of manufacturing the semi-conductor apparatus was prepared. A first interlayer insulating film 42 is formed on the semiconductor substrate 41, and a lower layer wiring 43 is embedded in the groove formed in the first interlayer insulating film 42. A second interlayer insulating film 44 is formed on the first interlayer insulating film 42.

Figure 16:
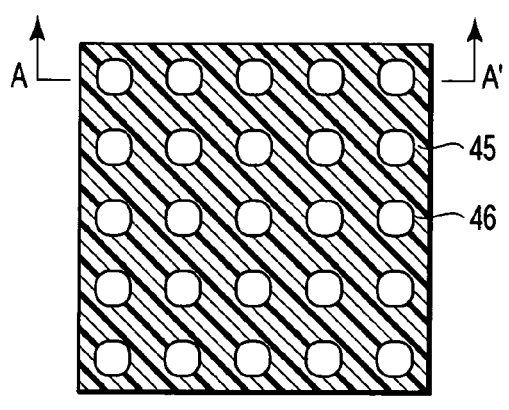
FIG. 16 is a plan view showing a structure of the semiconductor apparatus in the second step of the manufacturing method according to the first embodiment of the present invention.
Figure 17:
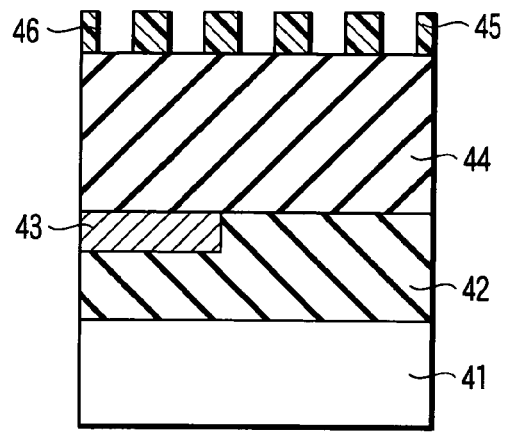
FIG. 17 is a cross sectional view, taken along the line A-A' in FIG. 16, showing a structure of the semiconductor apparatus shown in FIG. 16.

A resist film is coated on the second interlayer insulating film 44, and baking was performed to form a first resist film. Then, as shown in FIGS. 16 and 17, the pattern formed on the first reticle shown in FIG. 8 is transferred to the first resist film, a 100 nm 1:1 contact holes resist pattern 45 is formed after post exposure baking and development. The exposure condition is normal illumination of NA=0.75 and σ=0.85 with ArF light.

Next, the first resist film is irradiated with $Ar^+$ ion so as to make the first resist film pattern 45 insoluble before the second resist film is coated on the first resist film pattern 45. There are other insolubilizing methods, such as a UV light emitting method except for the $Ar^+$ ion irradiation method.

Figure 18:
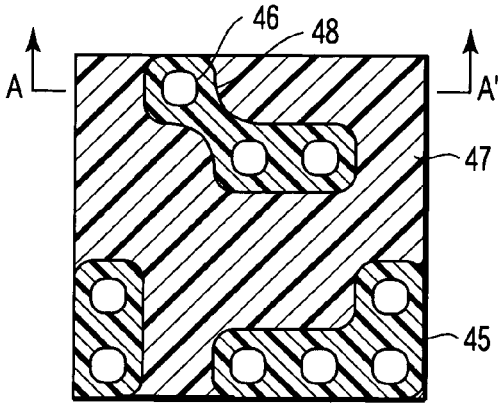
FIG. 18 is a plan view showing a structure of the semiconductor apparatus in the third step of the manufacturing method according to the first embodiment of the present invention.
Figure 19:
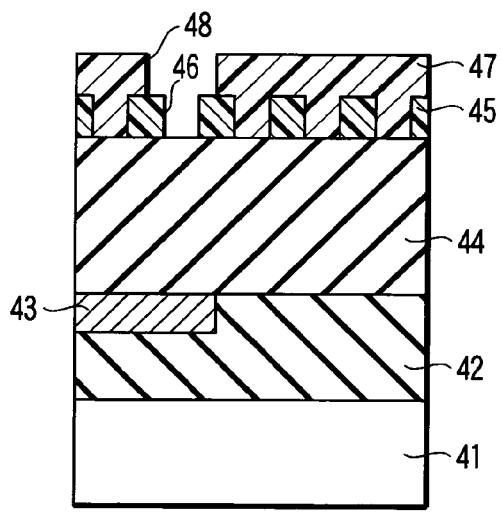
FIG. 19 is a cross sectional view, taken along the line A-A' in FIG. 18, showing a structure of the semiconductor apparatus shown in FIG. 18.

The second resist film is coated on the first resist film pattern, and baking is carried out to form the second resist film. The pattern formed on the second reticle shown in FIG. 9 is transferred to the second resist film, and then, the post exposure baking and development steps are carried out. As shown in FIGS. 18 and 19, the second resist film pattern 47 is formed such that the second resist film pattern 47 have openings 48 only on desired contact holes 46 among the periodic 100 nm 1:1 contact holes and covers the other unnecessary contact holes. The exposure condition for the pattern transfer is normal illumination of NA=0.75 and σ=0.3.

Figure 20:
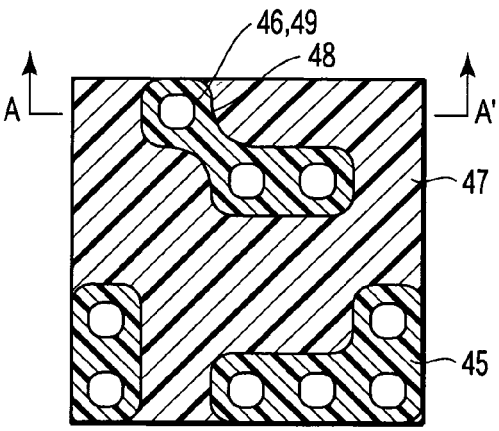
FIG. 20 is a plan view showing a structure of the semiconductor apparatus in the fourth step of the manufacturing method according to the first embodiment of the present invention.
Figure 21:
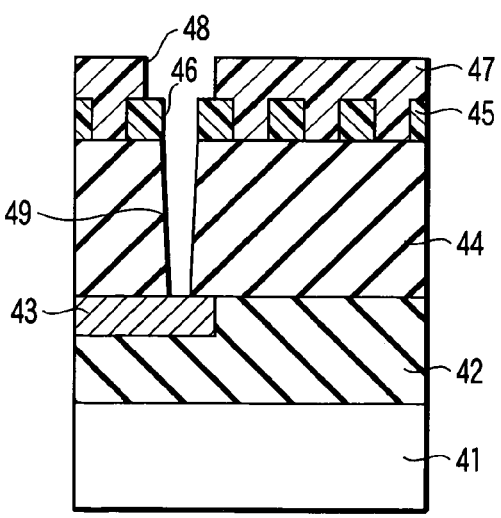
FIG. 21 is a cross sectional view, taken along the line A-A' in FIG. 19, showing a structure of the semiconductor apparatus shown in FIG. 19.

After that, the second interlayer insulating film 44 is etched by using fluorine based gas, using the first and second resist film patterns 45 and 47 as an etching mask. As a result of etching, as shown in FIGS. 20 and 21, a contact hole 49 is formed on the second interlayer insulating film 44. As shown in FIGS. 22 and 23, a contact plug 50 is embedded in the contact hole 49.

The semiconductor apparatus manufacturing process using the first and second reticles shown in FIGS. 8 and 9 has been described above. Thereafter, an interlayer insulating film and wiring are further formed, and a semiconductor apparatus is completed.

In the designing of the second mask pattern data, after opening patterns are arranged at grid points at which contact holes included in the design pattern data are arranged, two opening patterns arranged at a pair of grid points which meets the condition described previously may be deleted and rectangular patterns inclined at an angle of 45 degrees may be arranged. FIG. 24 shows an opening pattern arranged at a pair of grid points which meets a condition included in the mask pattern data. As shown in FIG. 24, a rectangular pattern 60 is enough large to contain the pair of contact holes 11 arranged at the pair of grid points.

A rectangular pattern may be arranged in advance at a pair of grid points which meets the condition. In this case, the opening patterns are arranged at grid points at which the contact holes included in the design pattern data are arranged, except for the pair of grid points which meets the condition.

In the present embodiment, the periodic contact hole pattern of a lower layer and the opening pattern of an upper layer are formed by the resist film pattern. However, the material is not limited to the resist film pattern. A hard mask of, for example, SiN may be used to form the lower layer pattern.

Second Embodiment

A second embodiment describes a method of providing a dummy hole pattern so as not to form the pattern such that a corner of an opening comes into contact with the corner of another opening at a point.

FIG. 25 is a view showing a pattern included in a mask pattern data according to the second embodiment of the invention. As shown in FIG. 25, three openings 61, 62, and 63 are arranged at the grid points which meet the condition described in the first embodiment. In this case, if the opening pattern 63 is not connected to an upper layer wiring or a lower layer wiring, no conduction occurs, and thus, there is no problem even if this pattern exists. An example is shown in FIGS. 26 and 27. FIGS. 26 and 27 are views showing a configuration of a semiconductor apparatus according to the second embodiment of the invention. FIG. 26 is a plan view of the semiconductor apparatus, and FIG. 27 is a sectional view taken along the line A-A' of FIG. 26. In FIGS. 26 and 27, same elements of FIGS. 22 and 23 are designated by same reference numerals, and description of these elements is omitted.

As shown in FIGS. 26 and 27, a dummy contact hole 51 is formed in correspondence with the opening pattern 63 of the mask pattern data. A dummy contact 52 embedded in the dummy contact hole 51 is not connected to the lower layer wire 43 or an upper layer wire 53, and thus, there is no problem with the existence of this contact. In FIGS. 26 and 27, reference numeral 54 denotes a third interlayer insulating film.

In this case, a stable reticle pattern can be manufactured constantly, a reticle inspection can be properly carried out, and a good reticle can be produced, too. The contact hole to be conductive can be fabricated as desired.

In the present embodiment, the periodic contact hole pattern of a lower layer and the opening pattern of an upper layer are formed by the resist film pattern. However, the material is not limited to the resist film pattern. A hard mask of, for example, SiN may be used to form the lower layer pattern.

Third Embodiment

A third embodiment of the invention describes a method of changing a hole position in the step of auto wiring so as not to form the pattern such that a corner of an opening comes into contact with the corner of another opening at a point.

Upper layer wiring in a logic circuit is carried out by means of auto wiring an inhibition rule is provided, and auto wiring is carried out so as to meet this rule. A distance between contact holes can be included in the rule.

It is prohibited to arrange contact holes only at the pair of diagonal grid points among the four grid points configuring a unit grid. As a result, there is no pair of contact holes, for which the corners of the openings come into contact with each other at a point, and the problem that a part of the contact hole to be opened in the lower layer resist film is covered by the upper layer resist on the wafer is avoided. In addition, because a stable pattern can be manufactured constantly in reticle production, the reticle can be inspected properly, and a good reticle can be produced.

Fourth Embodiment

In the above embodiment, a desired pattern is obtained by forming the first and second resist film patterns. The insolubilizing process by emitting $Ar^+$ ion to the first resist film pattern before applying the second resist film onto the first resist film pattern is carried out to avoid the dissolution of the first resist pattern during coating of the second resist film However, in a conventional insolubilizing technique such as $Ar^+$ ion emission, UV cure and baking, the CDs of the first resist film are changed after the second resist film patterning, thus making it impossible to form a precise pattern.

The present embodiment describes a method capable of forming a precise pattern.

Figure 28:
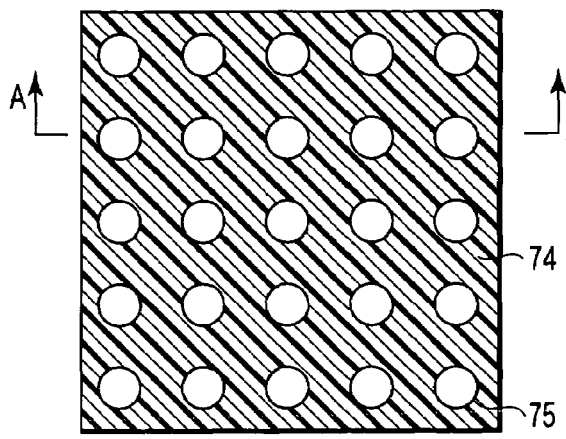
FIG. 28 is a plan view showing a structure of a semiconductor apparatus in the first step of a reference manufacturing method in the fourth embodiment of the present invention.
Figure 29:
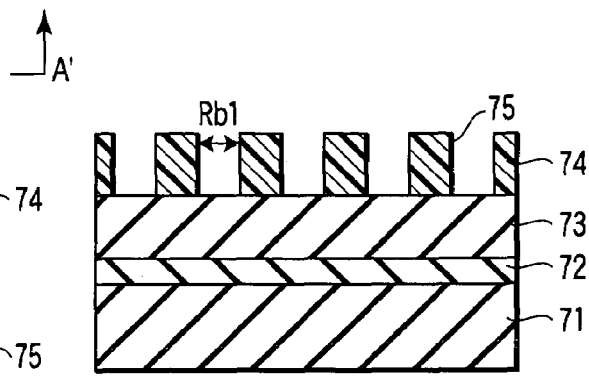
FIG. 29 is a cross sectional view, taken along the line A-A' in FIG. 28, showing a structure of the semiconductor apparatus shown in FIG. 28.
Figure 30:
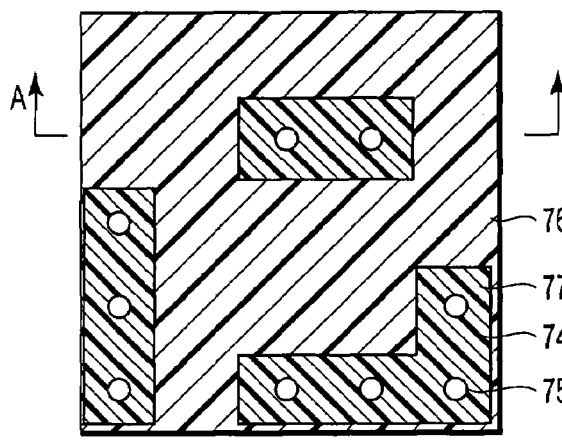
FIG. 30 is a plan view showing a structure of the semiconductor apparatus in the second step of the reference manufacturing method in the fourth embodiment of the present invention.
Figure 31:
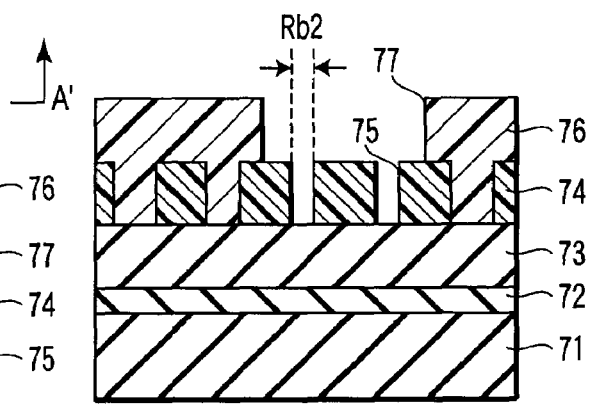
FIG. 31 is a cross sectional view, taken along the line A-A' in FIG. 30, showing a structure of the semiconductor apparatus shown in FIG. 30.

FIGS. 28 to 33 are views showing the steps of manufacturing a semiconductor apparatus in the fourth embodiment of the present invention. FIGS. 28 and 30 are plan views, and FIGS. 29 and 31 are cross sectional views taken along the line A-A' of FIGS. 28 and 30, respectively.

In the present embodiment, a to-be-processed film was a 750 nm TEOS film. A spin-on carbon film and a spin-on glass (SOG) film were coated on the to-be-processed film, for lithography. Resist films were sequentially formed on the film structure.

First, as shown in FIG. 28, a spin-on carbon film 72 and a spin-on glass (SOG) film 73 were coated on a TEOS film 71. A first resist film 74 was formed on the SOG film 73. Then, the pattern formed on the first reticle shown in FIG. 8 was transferred to the first resist film 74, and 110 nm 1:1 contact hole resist pattern was formed after the post exposure baking process and development process. The contact hole 75 was formed by means of quadru pole illumination. The exposure light was ArF, the illumination condition was NA=0.78, $\sigma_{out}$=0.9, $\sigma_{in}$=0.70, and an aperture was positioned at a cross position. After the patterning, the diameter $R_{b1}$ of the contact hole 75 was 110 nm, which is the final target CD.

When the upper layer resist is coated thereon, the lower layer resist is dissolved by the resist solvent. To avoid that, the first resist pattern was insolubilized by UV light curing. The insolubilizing also can be carried out by $Ar^+$ ion implantation, by baking and so on.

Thereafter, as shown in FIGS. 30 and 31, a second resist film 76 was formed, and an opening 77 for a desired contact hole was formed in the second resist film 76. An annular illumination of NA=0.78, σ=0.9, and ε=0.68 was used for pattern exposure. By forming the second resist film 76, the diameter $R_{b2}$ of the contact hole pattern 72 of the first resist film 74 became 75 nm.

The cause for such CD change was not clarified but speculated. One of the causes was as follows. That is, insolubilizing of the first resist film 74 was insufficient, mixing occurs at the side wall of the first resist film 74 during coating of the second resist film 76, and a resist at the side wall of the first resist film 74 did not dissolve during developing the second resist film 76. In addition, another one of the causes was as follows. That is, since the second resist film 76 was formed on the first resist film 74, light was interrupted by the first resist film 74. The second resist film 76 on the side face of the first resist film 74 did not dissolve.

Thus, in order to obtain a 1:1 resist pattern, $R_{b2}$ must be 110 nm. Therefore, an exposure dose was adjusted so that the diameter $R_{b1}$ of the contact hole 75 was 145 nm when the lower layer resist pattern was formed.

Figure 32:
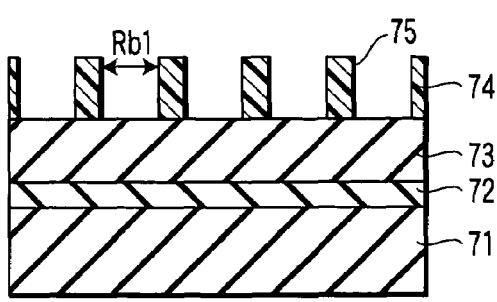
FIG. 32 is a cross sectional view showing a structure of the semiconductor apparatus in the first step of the manufacturing method according to the fourth embodiment of the present invention.
Figure 33:
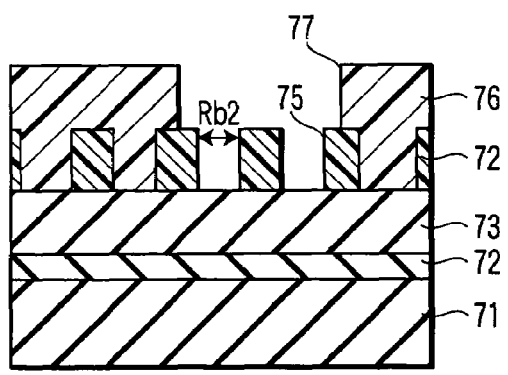
FIG. 33 is a cross sectional view showing a structure of the semiconductor apparatus in the second step of the manufacturing method according to the fourth embodiment of the present invention.

FIG. 32 shows the contact hole 75 after the diameter $R_{b1}$ was adjusted. Further, FIG. 33 shows the view after patterning the opening 77 in the second resist pattern 76. When the diameter $R_{b2}$ of the contact hole 75 was measured, the resist pattern with the desired CD was successfully obtained.

Fifth Embodiment

The present embodiment describes the case to obtain a contact hole pattern by forming line and space (L & S) patterns which cross each other with respect to the lower and upper layer resist films.

Figure 34:
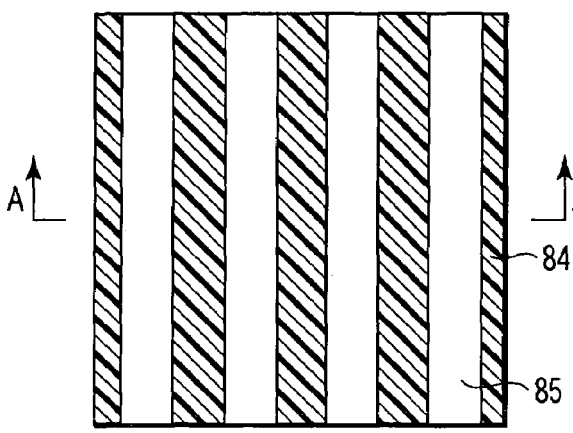
FIG. 34 is a plan view showing a structure of a semiconductor apparatus in the first of a reference manufacturing method in the fifth embodiment of the present invention.
Figure 35:
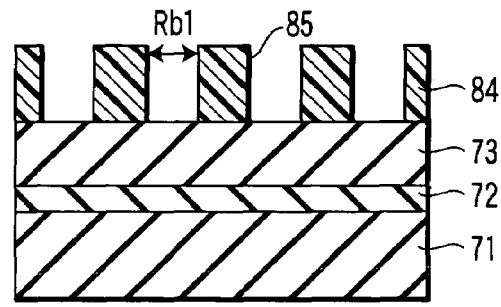
FIG. 35 is a cross sectional view, taken along the line A-A' in FIG. 34, showing a structure of the semiconductor apparatus shown in FIG. 34.
Figure 36:
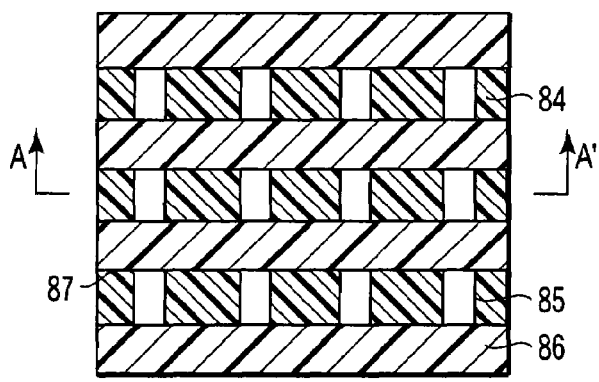
FIG. 36 is a plan view showing a structure of the semiconductor apparatus in the second step of the reference manufacturing method in the fifth embodiment of the present invention.
Figure 37:
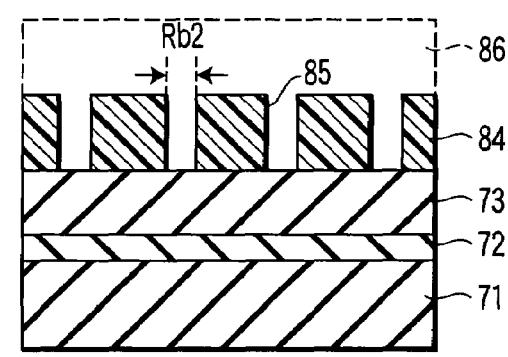
FIG. 37 is a cross sectional view, taken along the line A-A' in FIG. 36, showing a structure of the semiconductor apparatus shown in FIG. 36.

FIGS. 34 to 39 are views showing the steps of manufacturing a semiconductor apparatus in the fifth embodiment of the present invention. FIGS. 34 and 36 are plan views, and FIGS. 35 and 37 are cross sectional views taken along the line A-A' of FIGS. 34 and 36.

As shown in FIGS. 34 and 35, the first resist film 84 was formed on the SOG film 73. After a 80 nm 1:1 L&S (line and space) pattern was transferred to the first resist film 84, post exposure baking (PEB) and development were carried out to form the space 85. In the transfer of the pattern, ArF light and dipole illumination, in which the apertures are arranged to be perpendicular to the lines of NA=0.78, $\sigma_{out}$=0.9, and $\sigma_{in}$=0.75 were used. The width $R_{b1}$ of the space 85 was 80 nm. Then, an insolubilizing process for the first resist film 84 was carried out in the same manner as in the fourth embodiment.

Next, as shown in FIGS. 36 and 37, the second resist film 86 was formed on the first resist film 84. After a 80 nm 1:1 L&S pattern orthogonal to an extension direction of the space 85 was transferred onto the second resist film 86, PEB and development are carried out to form a space 87. The width $R_{b2}$ of the space 85 after this process was 45 nm which is different from 80 nm just after the first pattern formation.

Thus, in order to obtain a 1:1 resist pattern, $R_{b2}$ must be 80 nm. Therefore, an exposure dose was adjusted so that the width $R_{b1}$ of the space 85 of the lower layer resist is 115 nm when the lower layer resist pattern is formed.

Figure 38:
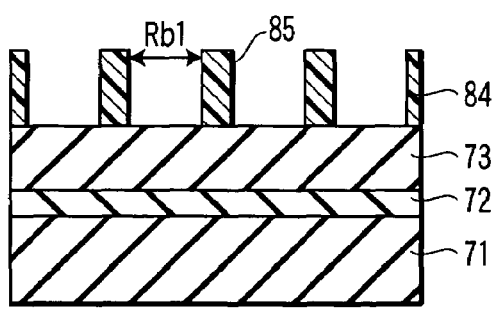
FIG. 38 is a cross sectional view showing a structure of the semiconductor apparatus in the first step of the manufacturing method according to the fifth embodiment of the present invention.
Figure 39:
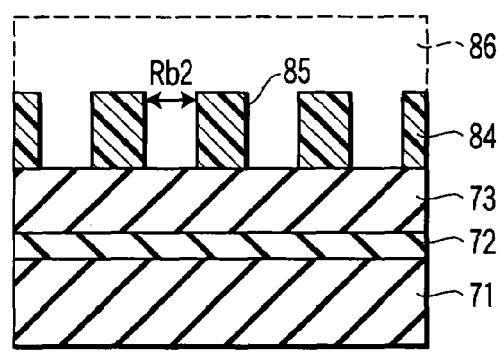
FIG. 39 is a cross sectional view showing a structure of the semiconductor apparatus in the second step of the manufacturing method according to the fifth embodiment of the present invention.

FIG. 38 shows the view after adjusting the width $R_{b1}$. Further, FIG. 39 shows the view after forming openings in the second resist pattern 86. When the diameter $R_{b2}$ of the space 85 was measured, the resist pattern with the desired CD was successfully obtained.

Although the desired CD of the lower layer resist was obtained by adjusting the exposure dose at the time of forming the lower layer resist, the reticle pattern CD may be changed instead of adjusting the exposure dose.

In addition, although the resist pattern was formed by light exposure with a reticle, an electron beam may be used to expose the resist. In this case, the data produced in advance determines the electron beam irradiation region. As described above, the data is corrected in order to obtain the desired CDs of the lower layer resist pattern.

It is possible to form a contact hole pattern by using another method as well as the method for superposing two L&S patterns which are orthogonal to each other. For example, as shown in FIG. 40, a space 88 in the second resist film 86 may be arranged so as to have an angle of 60 degrees with respect to the space 85 of the first resist film 84. Moreover, a three-layered resist film is formed in such a manner that each space may be inclined in steps of 60 degrees. In addition to the dense contact hole pattern, as shown in FIG. 41, a dense L&S pattern (first resist film) 84 may be formed in one direction, and an isolated space (second resist film) 86 may be formed in the other direction, which form contact holes arranged in line. In this case, optimized illumination can be selected for each pattern, that is, dipole illumination for the dense L&S pattern, and normal illumination with small σ for the isolated space, which makes it possible to form a finer pattern with a larger margin than the pattern which can be formed by one-time exposure. In the above description, the dense L&S pattern is first formed, and then, the isolated space is formed, however, the order of this sequence may be reversed.

The fifth embodiment is different from the fourth embodiment in that the upper layer resist does not determine the CDs of the processed film. Although the CDs of the processed film are determined by only the lower layer resist in the fourth embodiment, the CDs of the processed film in the transverse direction and in the longitudinal direction are determined by the lower layer resist and the upper layer resist, respectively, in the fifth embodiment.

Sixth Embodiment

A sixth embodiment of the invention describes the case of superposing two L&S patterns which are orthogonal to each other so that the common space area becomes a hole, followed by forming a resist opening pattern so that only desired contact holes open, and then, etching a processed film with the triple-layered resist pattern as a patterning mask.

Figure 42:
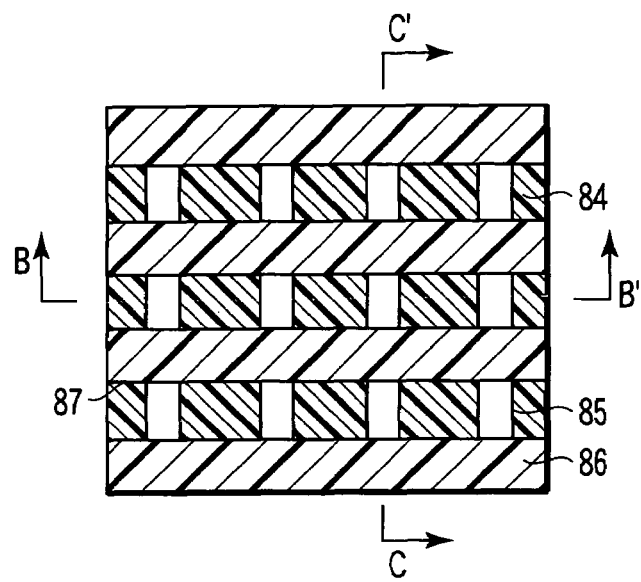
FIG. 42 is a plan view showing a structure of a semiconductor apparatus in the second step of the reference manufacturing method in the sixth embodiment of the present invention.
Figure 43:
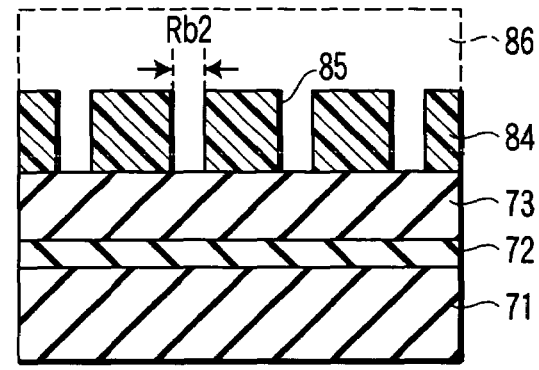
FIG. 43 is a cross sectional view, taken along the line B-B' in FIG. 42, showing a structure of the semiconductor apparatus shown in FIG. 42.
Figure 44:
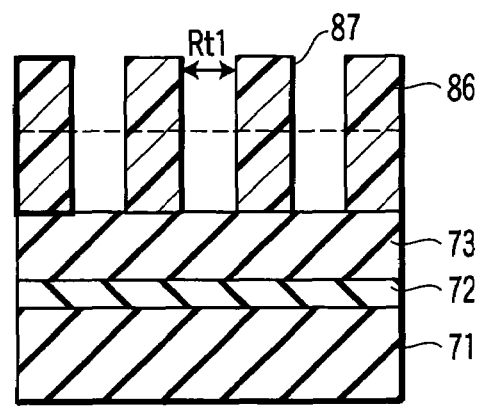
FIG. 44 is a cross sectional view, taken along the line C-C' in FIG. 42, showing a structure of the semiconductor apparatus shown in FIG. 42.
Figure 45:
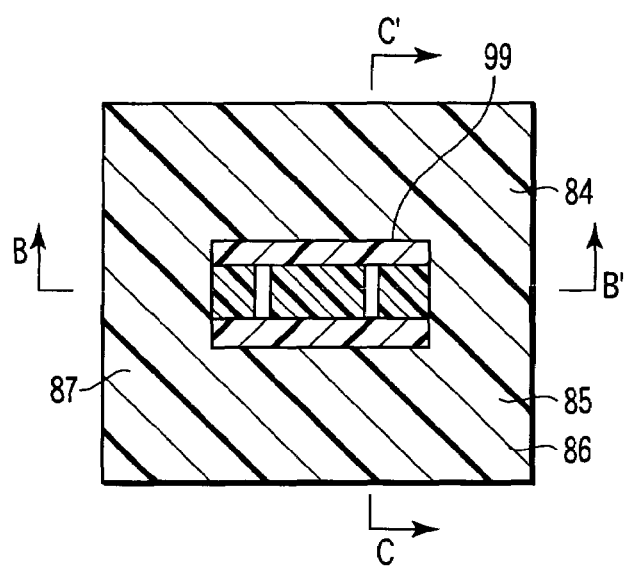
FIG. 45 is a plan view showing a structure of the semiconductor apparatus in the third step of the reference manufacturing method in the sixth embodiment of the present invention.
Figure 46:
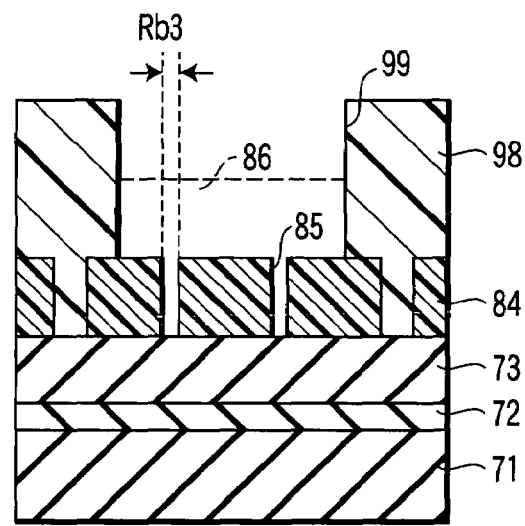
FIG. 46 is a cross sectional view, taken along the line B-B' in FIG. 45, showing a structure of the semiconductor apparatus shown in FIG. 45.
Figure 47:
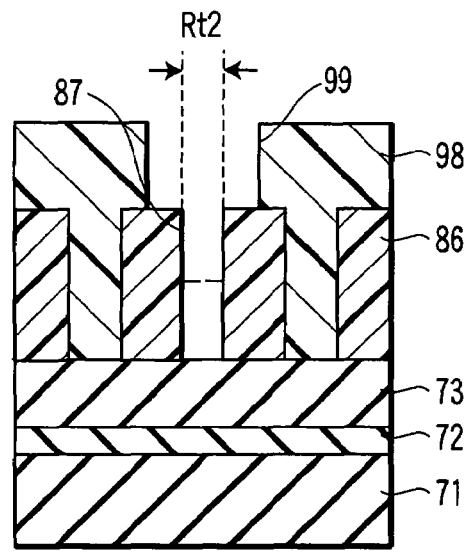
FIG. 47 is a cross sectional view, taken along the line C-C' in FIG. 45, showing a structure of the semiconductor apparatus shown in FIG. 45.
Figure 48:
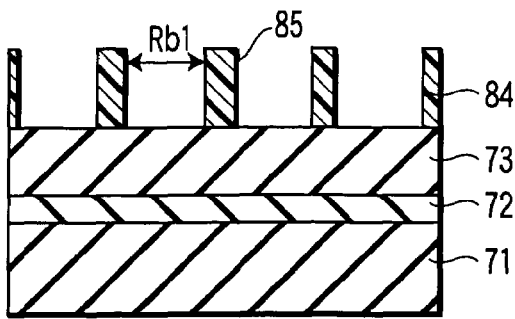
FIG. 48 is a cross sectional view showing a structure of a semiconductor apparatus in the first step of a manufacturing method according to the sixth embodiment of the present invention.
Figure 49:
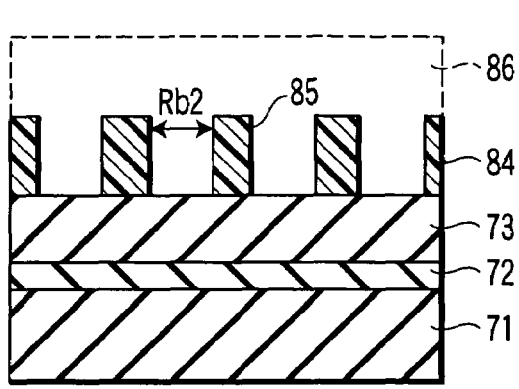
FIG. 49 is a cross sectional view showing a structure of the semiconductor apparatus in the second step of the manufacturing method according to the sixth embodiment of the present invention.
Figure 50:
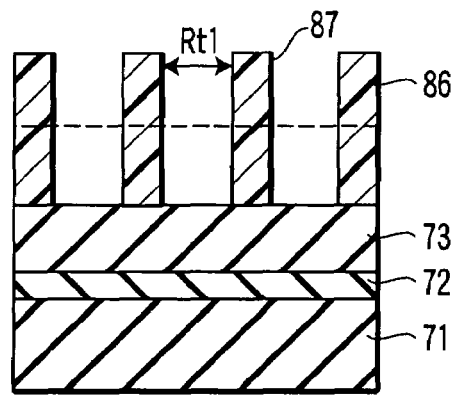
FIG. 50 is a cross sectional view showing a structure of the semiconductor apparatus in the second step of the manufacturing method according to the sixth embodiment of the present invention.
Figure 51:
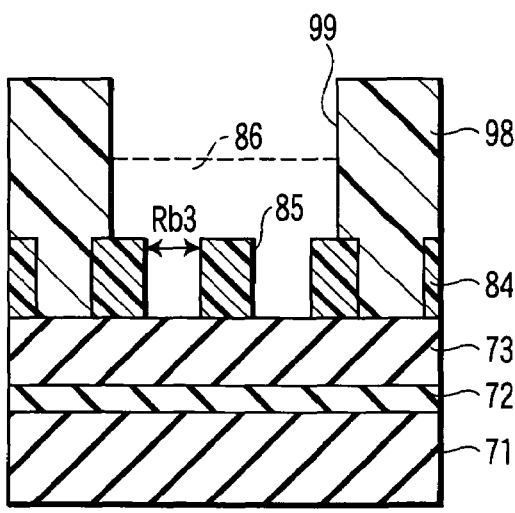
FIG. 51 is a cross sectional view showing a structure of the semiconductor apparatus in the third step of the manufacturing method according to the sixth embodiment of the present invention.
Figure 52:
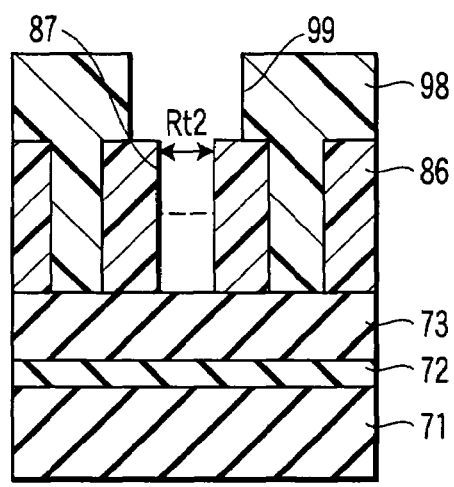
FIG. 52 is a cross sectional view showing a structure of the semiconductor apparatus in the third step of the manufacturing method according to the sixth embodiment of the present invention.

FIGS. 42 to 52 are views showing the steps of manufacturing a semiconductor apparatus in the sixth embodiment of the invention. FIGS. 48 to 52 are views showing the manufacturing step after CD was corrected. FIGS. 42 and 45 are plan views, FIGS. 43 and 46 are sectional views taken along the line B-B' of FIGS. 42 and 45, and FIGS. 44 and 47 are sectional views taken along the line C-C' of FIGS. 42 and 45. In addition, FIG. 49 is a sectional view corresponding to FIG. 43, and FIG. 50 is a sectional view corresponding to FIG. 44. FIG. 51 is a sectional view corresponding to FIG. 46, and FIG. 52 is a sectional view corresponding to FIG. 47. The structure under the first resist is similar to that according to the fourth embodiment.

As shown in FIGS. 42, 43 and 44, the first and second resist films 84 and 86, of which space 85 and 86 are orthogonal to each other were formed. Because the steps defined to form the orthogonal L&S patterns are identical to those according to the fifth embodiment, a detailed description is omitted here. A width $R_{b2}$ of the space 85 was 45 nm instead of 80 nm measured just after the first L&S pattern formation a width $R_{t1}$ of the space in the second resist film 86 was n 80 nm.

Next, as shown in FIGS. 45, 46 and 47, the third resist film 98 was formed on the first and second resist films 84 and 86. An opening 99 was formed at a predetermined position of the third resist film 98. After the opening 99 of the third resist film 98 was formed, a width $R_{b3}$ of the space 85 was 20 nm, and a width $R_{t2}$ of the space 87 was 45 nm.

In order to obtain a 80 nm hole pattern, the widths $R_{b3}$ and $R_{t2}$ must be 80 nm. Thus, as shown in FIG. 48, the width $R_{b1}$ of the space 85 was set to 140 nm. Next, as shown in FIGS. 49 and 50, the width $R_{t1}$ of the space 87 was set to 115 nm. Then, as shown in FIGS. 51 and 52, the opening 99 of the third resist film 98 was formed. In this case, when the widths $R_{b3}$ and $R_{t2}$ were measured, the measured widths were 80 nm, so the resist pattern having desired dimensions was successfully obtained.

Although the desired CDs of the lower layer resist were obtained by adjusting an exposure dose during forming of the lower layer resist, the CDs of the reticle pattern may be changed instead of adjusting exposure dose.

The above embodiment has shown an example in which the CDs of the lower layer resist pattern are greatly changed by forming the upper resist pattern. However, this absolute value depends on resist material, film structure, an insolubilizing process and the like.

In addition, if the condition with a small amount of CD change due to forming the upper layer resist can be used, it is possible to increase the number of resist layers to be superposed. The number of layers to be superposed is not limited.

The present embodiment discloses a method for superposing a plurality of resist patterns to produce an etching mask. Therefore, a variation of resist patterns is not limited to the above. For example, the present embodiment can be used for a method to form periodic L&S patterns with a Levenson mask, followed by covering an unnecessary pattern to form an isolated space.

Seventh Embodiment

A seventh embodiment of the invention describes that, when a to-be-processed film is etched to obtain a desired pattern after forming orthogonal L&S patterns twice, the CD difference between the resist pattern and the etched pattern (processing conversion difference) must be changed for each resist layer which defines CDs.

Figure 53:
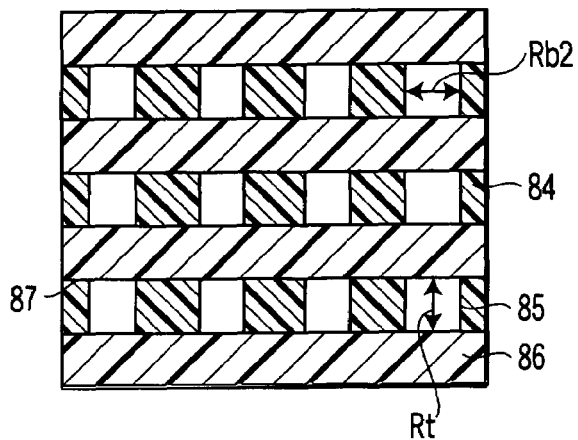
FIG. 53 is a plan view showing the pattern made of the first and second resist films in seventh embodiment of the present invention.

A method for forming 80 nm 1:1 L&S patterns twice described in the fifth embodiment. FIG. 53 shows patterns of the first and second resist patterns. The hole diameter in the transverse direction is defined by the first resist film 84. The width $R_{b2}$ of the space 85 of the first resist film 84 was 80 nm. The hole diameter in the longitudinal direction is defined by the second resist film 86. The width $R_t$ of the space 87 of the second resist film 86 was 80 nm.

Figure 54:
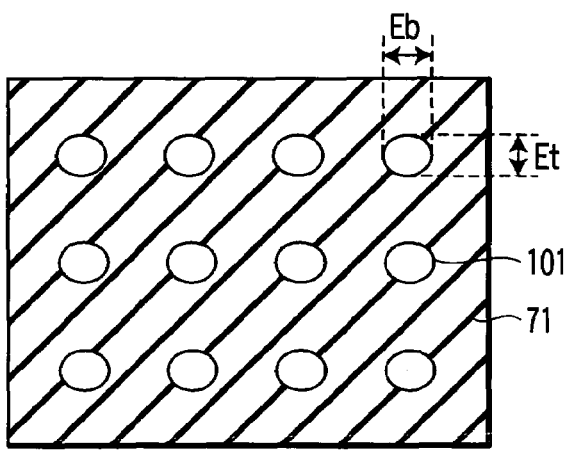
FIG. 54 is a plan view showing a TEOS film processed by using the patterns of the first and second resist films shown in FIG. 53.

A case of etching a to-be-processed film by using the resist pattern composed of a plurality of layers as a mask is described below. A spin-on glass film, a spin-on carbon film, and a TEOS film were etched in sequence. FIG. 54 is a plan view of the TEOS film when the spin-on carbon film is removed after TEOS etching. The CDs of the resist pattern were identical in both of the longitudinal direction and the transverse direction. However, when the TEOS pattern was measured after etching, a diameter $E_b$ of a hole 101 formed in the TEOS film 71 in the transverse direction was 75 nm, and a diameter $E_t$ thereof in the longitudinal direction was 70 nm.

Figure 55:
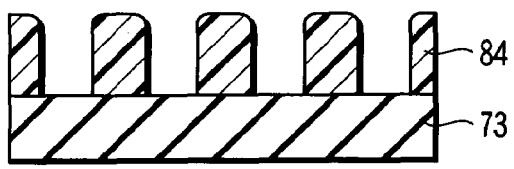
FIG. 55 is a cross sectional view showing the first resist film in the seventh embodiment of the present invention.
Figure 56:
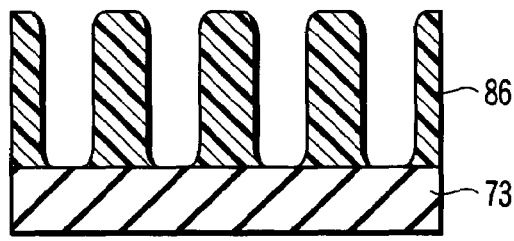
FIG. 56 is a cross sectional view showing the second resist film in the seventh embodiment of the present invention.

To investigate this cause, the cross-sectional views of the first and second resist films were observed. FIGS. 55 and 56 are sectional views showing the first and second resist films according to the seventh embodiment. FIG. 55 is the cross-sectional view showing the first resist film, and FIG. 56 is a sectional view showing the second resist film. In comparison between these films, the second resist film 86 has a larger footing than the first resist film 84. The CD difference between the resist pattern and the etched pattern are large due to the large footing of the second resist film.

The target of the hole was 160 nm in pitch and 75 nm in diameter. From the foregoing results, the process conversion difference in the upper layer resist is found to be 10 nm. Therefore, the space width Rt of the second resist film 86 was increased to 85 nm.

When the L&S patterns are superposed on each other twice, the space CD at the lower resist layer must be 80 nm, and the space CD at the upper resist layer must be 85 nm. Thus, at the time forming the lower resist pattern, the space CD of the lower layer resist was set to 115 nm in by adjusting exposure dose considering the quantity of the CD change of 35 nm caused by forming the upper layer resist pattern.

Figure 57:
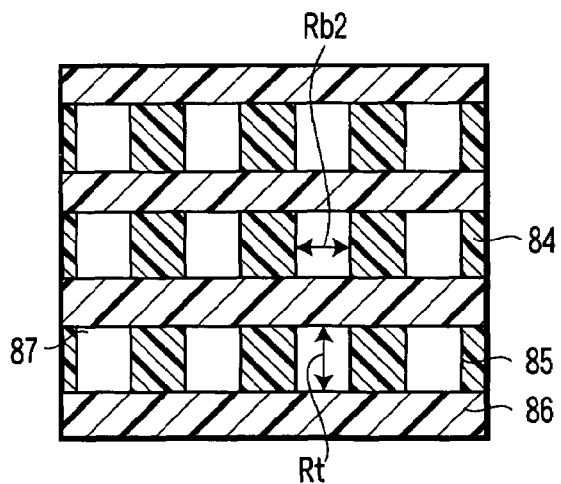
FIG. 57 is a plan view showing the pattern made of the first and second L&S pattern resist films.
Figure 58:
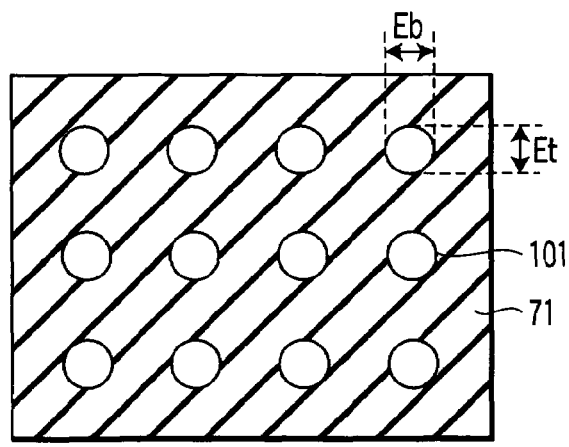
FIG. 58 is a plan view showing a TEOS film processed by using the pattern made of the first and second resist films shown in FIG. 57.

As shown in FIG. 57, double-layered resist having 80 nm width for the space Rb2 and 85 nm width for the space Rt was formed. FIG. 58 shows a plan view of the TEOS film 71 after etching. The hole that has 75 nm in diameter both in the transverse direction ($E_b$) and in the longitudinal direction ($E_t$) was successfully formed.

It is necessary to obtain a process conversion difference in etching for each resist layer which defines the pattern CDs of a to-be-processed film in the case where there is difference in pattern shapes among resist layers. Although it is desirable that there is no difference in pattern shapes, it is not easy to avoid under the condition that a resist is insolubilized by UV cure used in the present embodiment. The photoacid generator in the spin-on glass was decomposed by UV cure. Sufficient amount of acid was contained in order to form resist pattern on the spin-on glass only once. Proper amount of acid was added to avoid notch at the bottom of the resist pattern. However, the photoacid generator was insufficient to form the second resist pattern.

A hole diameter in the transverse direction is defined by the first resist film 84, and a hole diameter in the longitudinal direction is defined by the second resist film 86. Therefore, it is necessary to obtain the process conversion difference in etching for each resist film. In the case of the fourth embodiment, however, the CDs of the processed film are only defined by the lower layer contact hole pattern, and the CDs of the processed film are not defined by the upper layer opening pattern. Namely, the process conversion difference may be considered only with respect to the lower layer resist pattern.

Eighth Embodiment

An eighth embodiment of the invention describes a method of correcting the reticles which are used to form the plurality of the resist patterns by light exposure, and a processed film is processed by using the resist pattern as an etching mask to obtain a desired pattern made of to-be-processed film.

Figure 59:
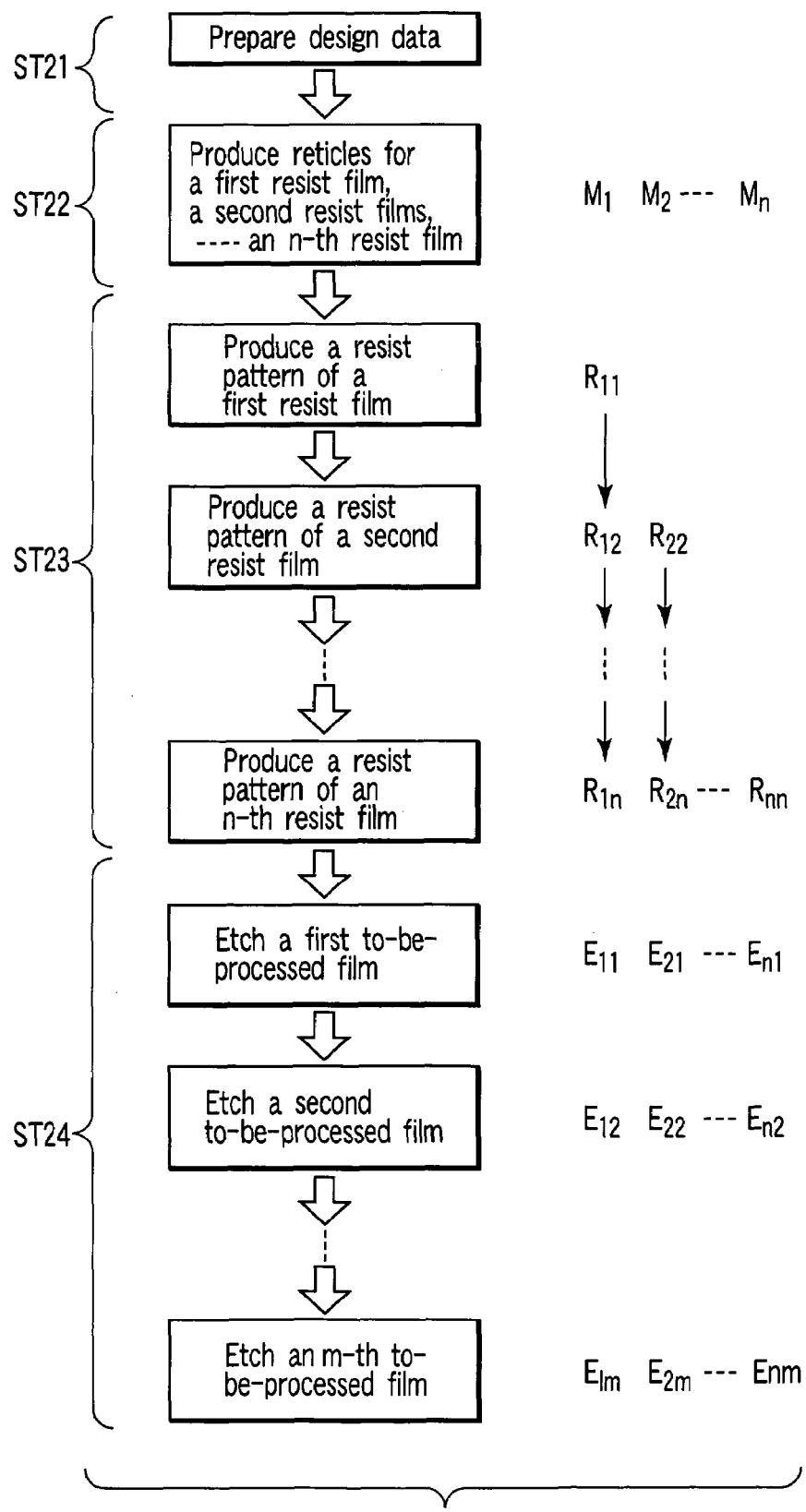
FIG. 59 is a flow chart showing a semiconductor manufacturing process according to the eighth embodiment of the present invention.

FIG. 59 is a flow chart showing a semiconductor manufacturing process.

Design data is prepared (step ST21). Reticles are designed and produced based on the design data (step ST22). Each of the reticles is for each resist layer, and reticles for n layers (n is an integer of 2 or more) are produced. The first reticle is for the first resist film. The second reticle is for the a second resist film and so on. N layers of resist Patterns are sequentially formed by using the plurality of produced reticles (step ST23).

The CD of the pattern formed in the first reticle for the exposure of the first resist film is $M_1$. The CD of the first resist film pattern formed by pattern exposure of the first reticle is $R_{11}$.

Next, a pattern of a second resist film is formed. The CD of the pattern formed in the second reticle for the exposure of the second resist film is $M_2$. The CD of the second resist film pattern formed by the exposure of the second reticle is $R_{22}$ (which means CD of the second resist film pattern after the second resist film was formed). At this time, the CD of the first resist film pattern is not $R_{11}$ but $R_{12}$ (which means CD of the first resist film pattern after the second resist film was formed). This is because the CDs of the lower layer resist are changed by forming the upper layer resist pattern, which was described in the previous embodiment. When the resist patterns were thus superposed sequentially, the CDs of the resist pattern of the first resist film is changed, which results in $R_{1n}$ when the n-th resist film patterns is formed. The same change happens in other layers. When all the resist patterns are fabricated, the CDs of the resist patterns to define the CDs of the processed film are obtained as $R_{1n}, R_{2n}, \ldots, R_{nn}$.

Thereafter, the to-be-processed films are etched. m-layered to-be-processed films are etched with the fabricated pattern made of the multi-layered resist films as a mask (step ST24). In the case of the seventh embodiment, the spin-on glass layer, the spin-on carbon film, and the TEOS film are sequentially etched. The first to-be-processed film is the spin-on glass film, the second to-be-processed film is the spin-on carbon, and the third processed film is the TEOS film. When m-th etching processes is, i.e., when final processing for the to-be-processed film (TEOS film processing in the case of the seventh embodiment) is completed, the CDs of the to-be-processed film are obtained as $E_{1m}$ (which means CDs of the to-be-processed film defined by the first resist pattern after the m-th to-be-processed film is etched), $E_{2m}, \ldots, E_{nm}$.

Figure 60:
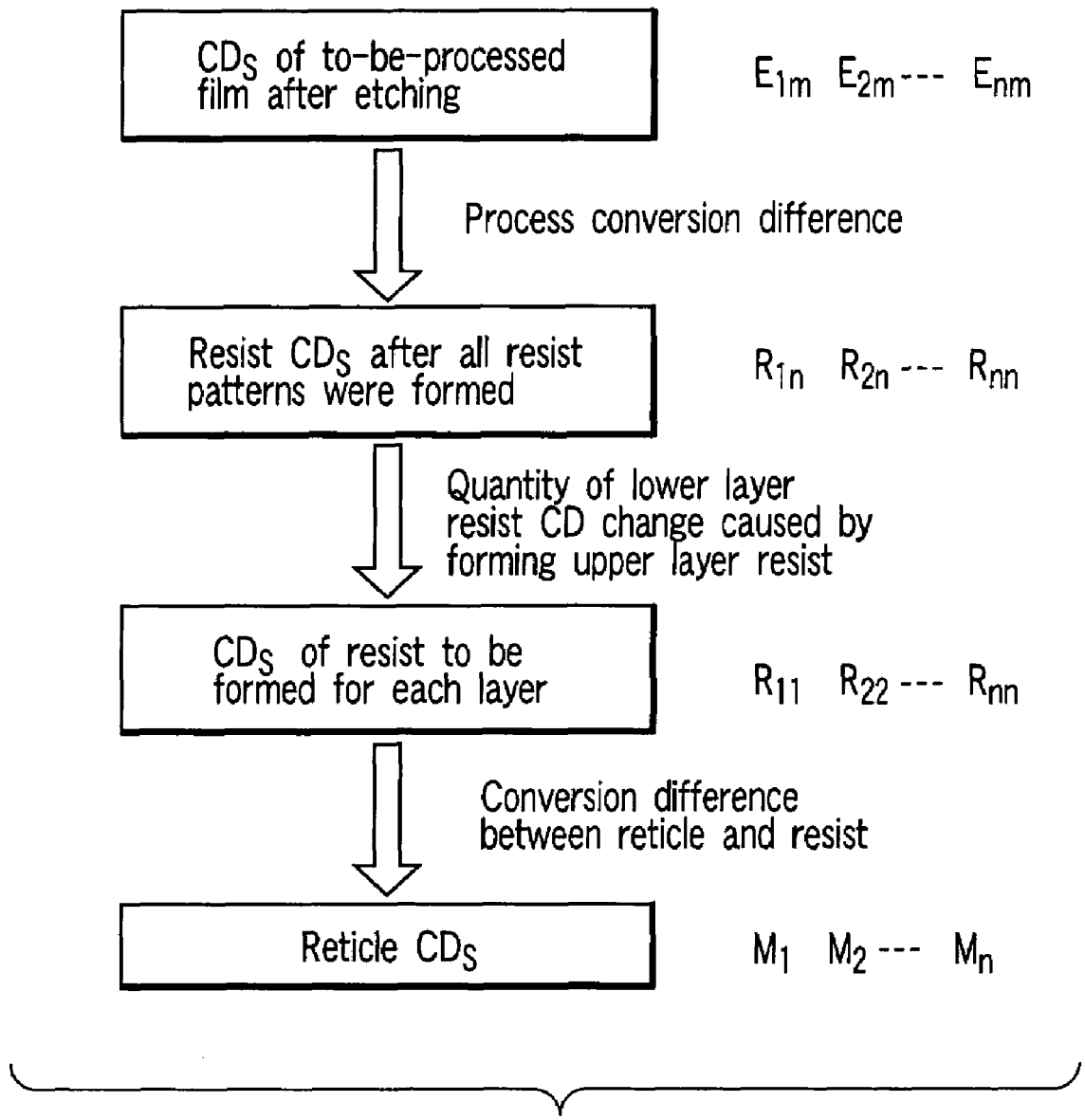
FIG. 60 is a view showing an outline of procedures for acquiring reticle CDs according to the eighth embodiment of the present invention.

Next, a method to obtain desired CDs of a to-be-processed film is described below. Procedures to obtain reticle CDs is described with reference to FIG. 60.

when all etching processes are completed, the CDs $E_{1m}, E_{2m}, \ldots, E_{mm}$ of the processed film must be desirable CDs. When the CDs are traced back, it is found that CDs after forming all the resist patterns $R_{1n}, R_{2n}, \ldots, R_{nn}$ must be desirable CDs which are calculated from the process conversion differences. The reticle CDs can be calculated from the desirable resist pattern CDs in the single layer resist process. However, in the case where the resist patterns are superposed on each other, the CDs of the lower layer resist pattern are changed by forming the upper layer resist pattern. Thus, the resist CDs just after forming each resist layer are not $R_{1n}, R_{2n}, \ldots R_{nn}$. Namely, the data relating to a quantity of the CD change of the lower layer resist caused by forming the upper layer resist is necessary. Next, the reticle CDs can be corrected by obtaining the reticle CDs $M_1, M_2, \ldots, M_n$ from the resist CDs of $R_{11}, R_{22}, \ldots, R_{nn}$. In this step, it is necessary to obtain the conversion difference between the reticle CDs and the resist CDs.

Figure 61:
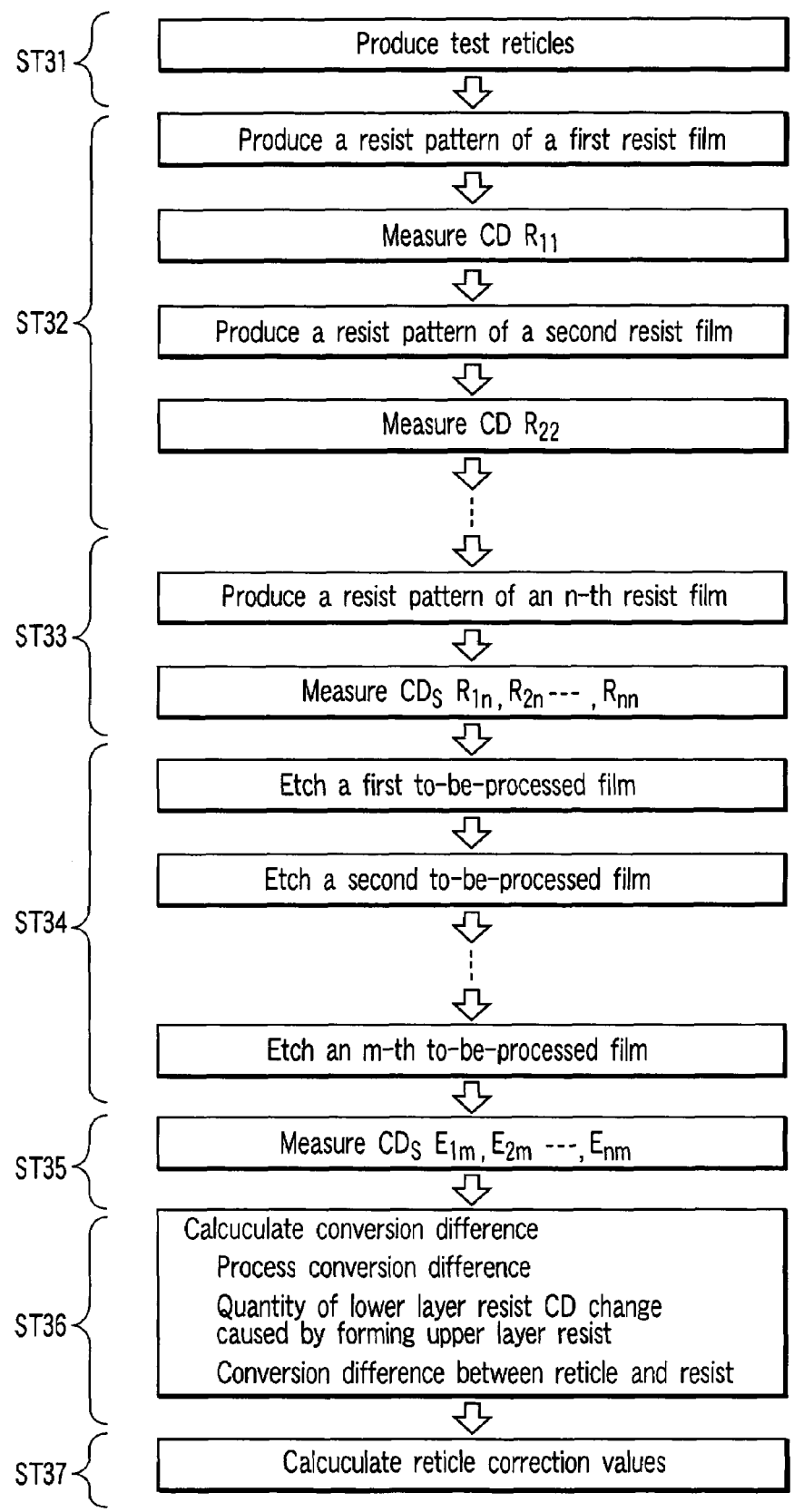
FIG. 61 is a flow chart showing procedures for correcting reticle CDs according to the eighth embodiment of the present invention.

FIG. 61 shows a flow of operation in order to obtain the above-described process conversion difference, the quantity of the CD change of the lower layer resist caused by forming the upper layer resist, and a conversion difference between the reticle CDs and the resist CDs.

First, test reticles are produced (step ST31). The test reticles are produced by changing the pattern CDs. By using the test reticles, the pattern of an i-th resist film is formed in accordance with the semiconductor manufacturing process. CD $R_{ii}$ of the pattern is measured just after the pattern formation (step ST32). Pattern of n-th resist films is formed, and CDs of each pattern are measured sequentially. After all the resist films are formed, the pattern CDs $R_{in}$ of the i-th resist film are measured with regard to all layers (step ST33).

Next, the to-be-processed films are etched (step ST34). When all of the to-be-processed films are processed, the dimensions $E_{1m}, E_{2m}, \ldots, E_{mm}$ of the to-be-processed films are measured (step ST35). In this manner, the process conversion difference, the quantity of the CD change of the lower layer resist caused by forming the upper layer resist, and the conversion difference between the reticle CDs and the resist CDs are calculated (step ST36). The conversion difference between the reticle CDs and the resist CDs can be obtained by the measured CDs $R_{ii}$ of the resist film immediately after i-th resist film formation. In addition, the quantity of the CD change of the lower layer resist caused by forming the upper layer resist can be obtained by the measured CDs $R_{in}$ of the resist film after all the layers are formed and the measured CDs Rii of the resist film just after i-th resist film formation. Also, the process conversion difference can be obtained by the measured CDs $E_{jm}$ of the to-be-processed film and the measured CDs $R_{jn}$ of the resist film after all layers are formed. Based on this difference, a correction values of the reticle CDs are calculated (step ST37).

When a pattern is formed by using the thus corrected reticles in terms of CDs, desired pattern CDs of the to-be-processed film was successfully obtained.

The present embodiment describes a method to correct reticle CDs in the case where the resist pattern is formed by light exposure using the reticle. The procedures can be applied with a slight change to another case as well.

In the case where a resist is exposed by an electron beam writer, the pattern data for electron beam writing is corrected. In this case, pattern data is produced instead of fabricating reticles, and pattern data is corrected instead of correcting reticles.

When a resist pattern is formed by light exposure using a reticle, the resist pattern CDs may be corrected in accordance with an exposure dose. In this case, an exposure dose condition is changed instead of test reticle fabrication, and the result may be used to correct the exposure dose.

As description in the above embodiments, according to the above mask pattern data producing method, while a desired contact holes can be formed, there is no pair of openings, of which the corners come into contact with each other at a point. As a result, a reticle pattern can be formed with high reproducibility. As a result, the reticle can be inspected properly, and a reticle without defect can be efficiently manufactured. As a result, the CD precision to process the to-be-processed film can be improved.

In the above reticle correcting method, the CDs of the reticle patterns to form the lower layer resist film patterns are corrected by measuring the quantity of the CD change of the lower layer resist film pattern caused by the formation of the upper layer pattern on the lower layer pattern, and the CDs of the reticle pattern is corrected based on the measured quantity. In this manner, the reticles to form the lower layer resist film patterns with desirable CDs after superposing a plurality of resist film patterns can be fabricated.

Further, the quantity of the CD change of the lower layer resist film pattern caused by the upper layer pattern formation on the lower layer pattern after formation of the lower layer pattern are measured, and the pattern CDs of the pattern data used to form the lower layer resist film pattern is corrected based on the measured quantity. In this manner, a pattern data can be fabricated such that the CDs of the lower layer resist film pattern after a plurality of resist film patterns is superposed become a desired value.

Moreover, the pattern CDs of the resist film pattern after all the resist film patterns are formed are corrected from the CD difference of the resist film and the desired CDs of the to-be-processed film pattern after etching in each resist film layer defining the pattern CDs of the to-be-processed film. In this manner, a process conversion difference can be corrected for each resist film layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask pattern data producing method comprising:
preparing design pattern data in which contact holes are arranged on random points of a grid arrayed in a matrix;
preparing first mask pattern data in which first opening patterns are arranged on all of the grid points; and
designing second mask pattern data in which second opening patterns and third opening patterns are arranged, the second opening patterns being arranged on the grid points on which the contact holes are arranged in the design pattern data to include the first opening patterns, and the third opening patterns comprising an auxiliary opening pattern connecting a pair of the second opening patterns arranged on a pair of diagonally positioned grid points in a unit grid formed by four grid points.

2. A mask pattern data producing method according to claim 1, wherein the auxiliary opening pattern is arranged between the second opening patterns on the pair of diagonally positioned grid points.

3. A mask pattern data producing method according to claim 1, wherein the auxiliary opening pattern is arranged on a grid point which is one of the four grid points forming the unit grid, other than the pair of diagonally positioned grid points and does not overlap with an under layer wiring connecting the second opening patterns on the pair of diagonally positioned grid points to each other.

4. A reticle manufacturing method comprising:
preparing first and second mask pattern data by using the mask pattern data producing method claimed in claim 1;
producing a first reticle on the basis of the first mask pattern data; and
producing a second reticle on the basis of the second mask pattern data.

5. A reticle manufacturing method comprising:
preparing first and second mask pattern data by using the mask pattern data producing method according to claim 2;
producing a first reticle on the basis of the first mask pattern data; and
producing a second reticle on the basis of the second mask pattern data.

6. A reticle manufacturing method comprising:
preparing first and second mask pattern data by using the mask pattern data producing method according to claim 3;
producing a first reticle on the basis of the first mask pattern data; and
producing a second reticle on the basis of the second mask pattern data.

7. A semiconductor device manufacturing method comprising:
forming a to-be-processed film on a semiconductor substrate;
forming on the to-be-processed film a first resist film having a first opening formed by using the first reticle, and forming on the first resist film a second resist film having a second opening formed by using the second reticle, wherein the first reticle and the second reticle are produced by the reticle manufacturing method claimed in claim 5 and
etching the to-be-processed film by using the first resist film and the second resist film.

8. A mask pattern data producing method according to claim 1, wherein the auxiliary opening pattern comprises the second opening patterns on the pair of diagonally positioned grid points being formed in a form of a continuous pattern to include the first opening patterns on the pair of diagonally positioned grid points.

* * * * *